(12) United States Patent
Lee et al.

(10) Patent No.: US 11,764,119 B2
(45) Date of Patent: Sep. 19, 2023

(54) INTEGRATED CIRCUIT DEVICES

(71) Applicant: SAMSUNG ELECTRONICS CO., LTD., Suwon-si (KR)

(72) Inventors: Seungheon Lee, Seoul (KR); Jaekang Koh, Seongnam-si (KR); Hyukwoo Kwon, Seoul (KR); Munjun Kim, Suwon-si (KR); Taejong Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 17/672,939

(22) Filed: Feb. 16, 2022

(65) Prior Publication Data
US 2022/0173002 A1 Jun. 2, 2022

Related U.S. Application Data

(63) Continuation of application No. 16/919,307, filed on Jul. 2, 2020, now Pat. No. 11,264,294.

(30) Foreign Application Priority Data

Oct. 29, 2019 (KR) .................. 10-2019-0135593

(51) Int. Cl.
*H01L 23/29* (2006.01)
*H01L 21/02* (2006.01)
*H01L 23/31* (2006.01)

(52) U.S. Cl.
CPC ........ *H01L 23/291* (2013.01); *H01L 21/0228* (2013.01); *H01L 23/3185* (2013.01)

(58) Field of Classification Search
None
See application file for complete search history.

(56) References Cited

U.S. PATENT DOCUMENTS

| | | | |
|---|---|---|---|
| 6,833,320 B2 | 12/2004 | Meagley et al. | |
| 7,704,881 B2 | 4/2010 | Klootwijk et al. | |
| 10,243,080 B2 | 3/2019 | Kloster et al. | |
| 2015/0380526 A1 | 12/2015 | Godet et al. | |
| 2016/0268171 A1* | 9/2016 | Wei | H01L 29/7851 |
| 2019/0148128 A1 | 5/2019 | Smith et al. | |
| 2020/0395244 A1 | 12/2020 | Lee et al. | |

FOREIGN PATENT DOCUMENTS

KR 10-2009-0045711 A 5/2009
KR 10-1090369 B1 12/2011

\* cited by examiner

*Primary Examiner* — Asok K Sarkar
(74) *Attorney, Agent, or Firm* — Lee IP Law, P.C.

(57) ABSTRACT

A method of manufacturing an integrated circuit device, the method including forming a plurality of target patterns on a substrate such that an opening is defined between two adjacent target patterns; forming a pyrolysis material layer on the substrate such that the pyrolysis material layer partially fills the opening and exposes an upper surface and a portion of a sidewall of the two adjacent target patterns; and forming a material layer on the exposed upper surface and the exposed portion of the sidewall of the two adjacent target patterns, wherein, during the forming of the material layer, the material layer does not remain on a resulting surface of the pyrolysis material layer.

20 Claims, 28 Drawing Sheets

INTEGRATED CIRCUIT DEVICES

CROSS-REFERENCE TO RELATED APPLICATIONS

This is a continuation application based on pending application Ser. No. 16/919,307, filed Jul. 2, 2020, the entire contents of which is hereby incorporated by reference.

Korean Patent Application No. 10-2019-0135593, filed on Oct. 29, 2019, in the Korean Intellectual Property Office, and entitled: "Integrated Circuit Devices and Manufacturing Methods for the Same," is incorporated by reference herein in its entirety.

BACKGROUND

1. Field

Embodiments relate to an integrated circuit device and a method of manufacturing the same.

2. Description of the Related Art

As integrated circuit devices are down scaled, the sizes of components of integrated circuit devices are also reduced. Methods of forming mask patterns using a double patterning technique or a quadruple patterning technique for forming micropatterns have been proposed, and the height of mask patterns is increased and the width thereof is decreased with a decrease in a device size.

SUMMARY

The embodiments may be realized by providing a method of manufacturing an integrated circuit device, the method including forming a plurality of target patterns on a substrate such that an opening is defined between two adjacent target patterns; forming a pyrolysis material layer on the substrate such that the pyrolysis material layer partially fills the opening and exposes an upper surface and a portion of a sidewall of the two adjacent target patterns; and forming a material layer on the exposed upper surface and the exposed portion of the sidewall of the two adjacent target patterns, wherein, during the forming of the material layer, the material layer does not remain on a resulting surface of the pyrolysis material layer.

The embodiments may be realized by providing a method of manufacturing an integrated circuit device, the method including forming a plurality of target patterns on a substrate such that an opening is defined between two adjacent target patterns; forming a pyrolysis material layer on the substrate such that the pyrolysis material layer partially fills the opening and has an upper surface arranged at a lower level than a level of an upper surface of the two adjacent target patterns; forming a material layer on the upper surface and an upper portion of a sidewall of the two adjacent target patterns that are not covered with the pyrolysis material layer as a part of the pyrolysis material layer is decomposed and removed; and performing a heat recess process to remove the remaining pyrolysis material layer after the material layer is formed to a predetermined thickness.

The embodiments may be realized by providing a method of manufacturing an integrated circuit device, the method including forming a mold stack on a substrate such that the mold stack includes a first mold layer and a second mold layer; forming a hardmask pattern on the mold stack; forming an opening by removing a portion of the second mold layer, using the hardmask pattern as an etching mask; forming a pyrolysis material layer that partially fills the opening and exposes an upper surface and a portion of a sidewall of the hardmask patterns; forming a hardmask capping layer on the upper surface and the portion of the sidewall of the hardmask pattern not covered with the pyrolysis material layer as the pyrolysis material layer is decomposed and removed; removing the pyrolysis material layer; and forming a mold structure by removing a portion of the first mold layer by using the hardmask pattern and the hardmask capping layer as an etching mask.

The embodiments may be realized by providing an integrated circuit device including a fin-type active area protruding from a substrate and extending in a first direction parallel to an upper surface of the substrate; a channel layer on an upper surface and an upper portion of a sidewall of the fin-type active area; a device isolation film on a lower portion of the sidewall of the fin-type active area on the substrate; and a gate structure on the fin-type active area and the device isolation film and extending in a second direction that is parallel to the upper surface of the substrate and perpendicular to the first direction, wherein a bottom surface of the channel layer is at a higher level than a bottom surface of the device isolation film.

BRIEF DESCRIPTION OF THE DRAWINGS

Features will be apparent to those of skill in the art by describing in detail exemplary embodiments with reference to the attached drawings in which.

DETAILED DESCRIPTION

FIGS. 1 to 6 are cross-sectional views of stages in a method of manufacturing an integrated circuit device 100 according to example embodiments.

Figure 1:
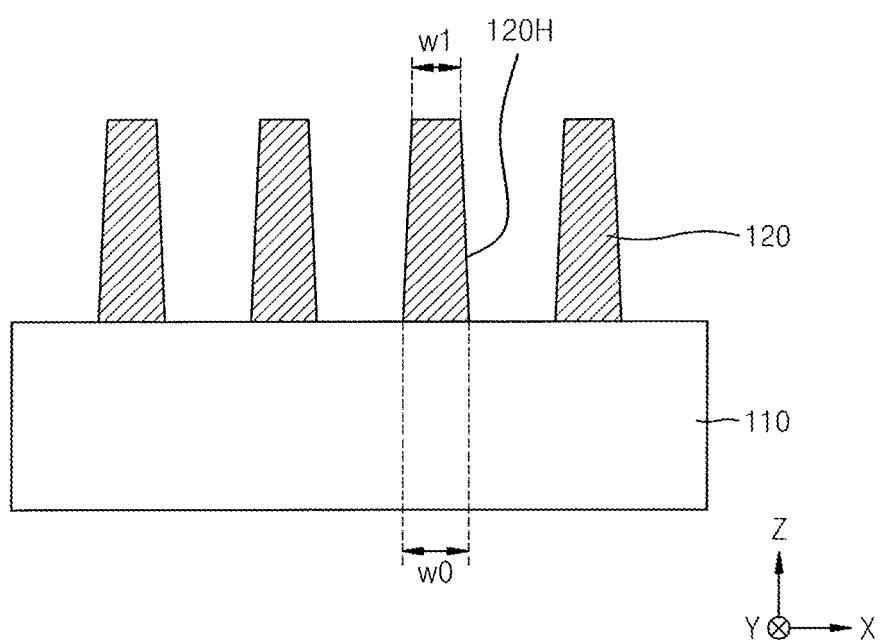
FIGS. 1 to 6 illustrate cross-sectional views of stages in a method of manufacturing an integrated circuit device according to example embodiments.

Referring to FIG. 1, a target pattern 120 may be formed on a substrate 110. The target pattern 120 may include a micropattern formed through photolithography patterning. In an implementation, the target pattern 120 may be formed by forming a target material layer on the substrate 110 and etching a portion of the target material layer by using a photoresist pattern on the target material layer. In an implementation, the target pattern 120 may be a portion of the substrate 110, and may be formed by forming a photoresist pattern on the substrate 110 and etching a portion of the substrate 110 by using the photoresist pattern. In an implementation, the target pattern 120 may be a mask pattern for etching a portion of the substrate 110. In an implementation, the target pattern 120 may be a portion of components included in various integrated circuit devices formed on the substrate 110, e.g., a portion of components included in a DRAM device, a PRAM device, an MRAM device, a RRAM device, a flash memory device, a logic device, a system LSI, a CMOS image sensor, or the like. In an implementation, the target pattern 120 may be a mask pattern for etching a portion of components included in the various integrated circuit devices.

The target pattern 120 may have a first width w0 in a first direction (X direction) parallel to an upper surface of the substrate 110. The target pattern 120 may be provided with an opening 120H extending from an upper surface of the target pattern 120 to a predetermined depth. In an implementation, the opening 120H may penetrate the target pattern 120 to expose the upper surface of the substrate 110. In an implementation, the opening 120H may not completely penetrate the target pattern 120 so that a portion of the target pattern 120 may remain on a bottom of the opening 120H.

The target pattern 120 may have a line shape extending in a second direction (Y direction), and the opening 120H may also have a line shape extending in the second direction (Y direction). In an implementation, the target pattern 120 may be arranged as an island type having a circular or rectangular vertical cross section, and the opening 120H may correspond to a space between the target patterns 120 of the island type. In an implementation, the opening 120H may be arranged as an island type having a circular or rectangular vertical cross section.

An upper width w1 of the target pattern 120 (in the first X direction) may be less than the first width w0 of the target pattern 120 (e.g., a part of the target pattern 120 distal to the substrate 110 in a vertical third direction, Z direction, may be narrower in the X direction than a part of the target pattern 120 proximate to the substrate 110 in the Z direction). This width difference may result from an etching amount of an upper sidewall of the target pattern 120 being larger than an etching amount of a lower sidewall of the target pattern 120, e.g., because the upper sidewall of the target pattern 120 may be more exposed to an etching atmosphere than the lower sidewall of the target pattern 120 during a process of etching the target pattern 120, thus making the upper width w1 of the target pattern 120 smaller than a target width (i.e., the first width w0). In an implementation, this width difference may result from a larger amount of the upper sidewall of the target pattern 120 being removed than the lower sidewall thereof through an ashing or cleaning process for removing etching by-products adhering on the sidewall of the target pattern 120 during the process of etching the target pattern 120.

Figure 2:
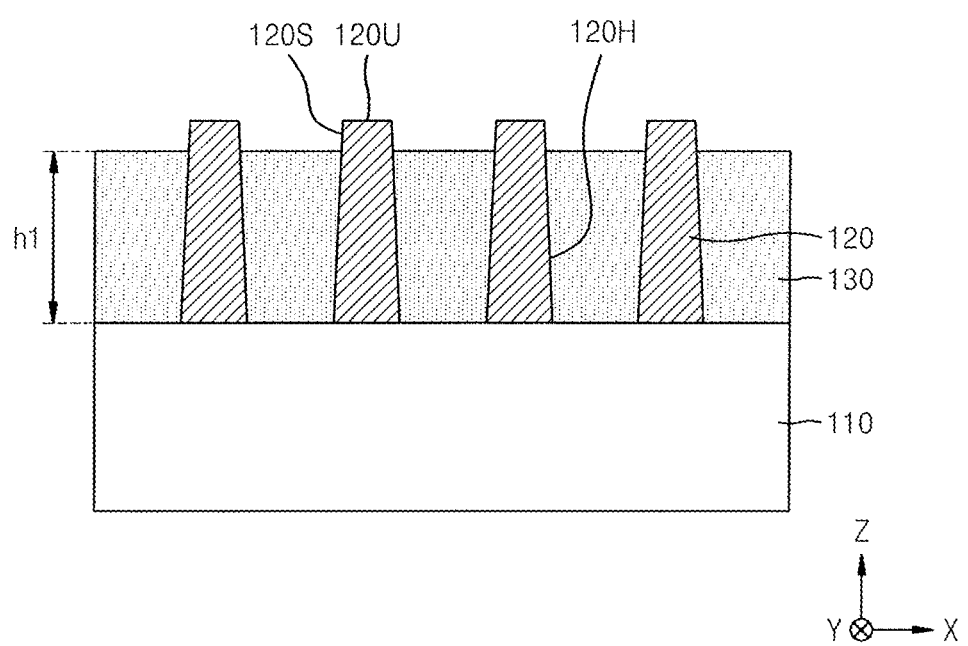

Referring to FIG. 2, a pyrolysis material layer 130 may be formed on the substrate 110. The pyrolysis material layer 130 may be formed to a first height h1 (e.g., from the substrate 110 in the Z direction) that is less than a height of the target pattern 120, and may (e.g., partially) fill the opening 120H, covering a lower portion of a sidewall 120S of the target pattern 120. In an implementation, an upper surface 120U and an upper portion of the sidewall 120S of the target pattern 120 may be exposed, e.g., not being covered with the pyrolysis material layer 130.

In an implementation, the pyrolysis material layer 130 may include a material that is decomposed, e.g., so as to be removed or at least partially removed, at a temperature of about 200° C. to about 400° C. In an implementation, the pyrolysis material layer 130 may include, e.g., an organic compound including carbon, oxygen, hydrogen, and nitrogen. In an implementation, the pyrolysis material layer 130 may include organic compounds including aromatic or aliphatic hydrocarbons, or derivatives thereof, or polymers thereof.

In an implementation, the pyrolysis material layer 130 may be formed through, e.g., a spin coating process, a chemical vapor deposition process, or the like. The pyrolysis material layer 130 may be formed by filling the opening 120H from a bottom to an upper portion thereof in a bottom-up manner. In an implementation, the pyrolysis material layer 130 may be formed through a spin coating process at a temperature of about 50° C. to about 200° C. and a pressure of from about 0 torr to about 760 torr. In an implementation, in order to form the pyrolysis material layer 130, after the pyrolysis material layer 130 is formed to a height sufficient to completely fill the opening 120H and cover the upper surface 120U of the target pattern 120, the upper surface 120U and the sidewall 120S of the target pattern 120 may be exposed again by decomposing and/or removing a portion of an upper part of the pyrolysis material layer 130 at an increased temperature.

Figure 3:
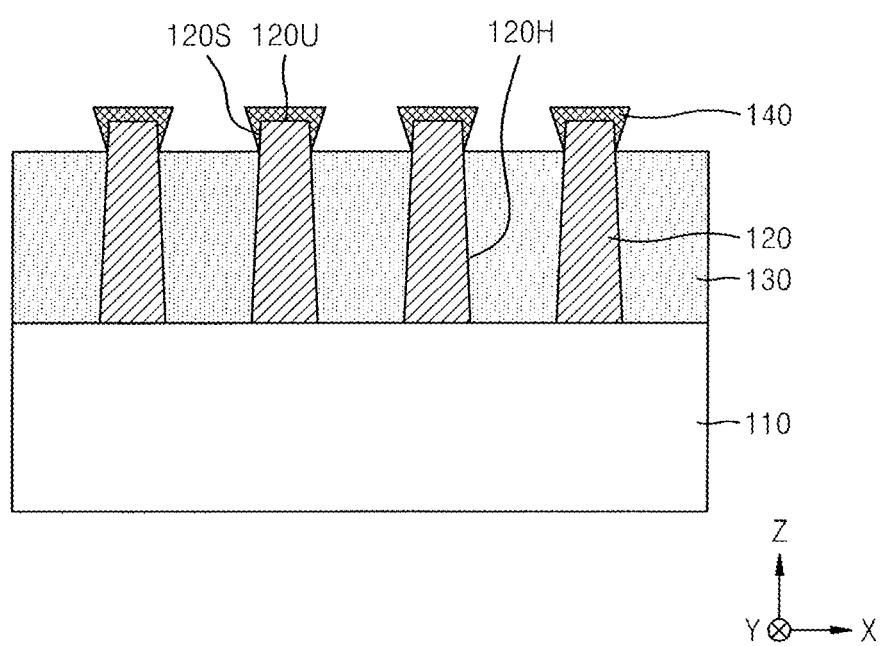

Referring to FIG. 3, a material layer 140 may be formed on the exposed upper surface 120U and the exposed sidewall 120S of the target pattern 120.

In an implementation, the material layer 140 may include, e.g., the same material as the material included in the target pattern 120. In an implementation, the material layer 140 may include a material different from the material included in the target pattern 120 and may be a material layer suitable for being selectively formed only on an exposed surface of the target pattern 120.

In an implementation, the material layer 140 may be formed through an atomic layer deposition process, a chemical vapor deposition process, a physical vapor deposition process, a spin coating process, a thermal oxidation process, or the like. The material layer 140 may be formed using, e.g., argon, helium, hydrogen, and nitrogen as carrier gas at a pressure of from about 0 to about 760 torr and a temperature of about 200° C. or higher. In an implementation, the material layer 140 may be formed at a temperature of, e.g., about 200° C. to about 450° C. In an implementation, the material layer 140 may include, e.g., silicon oxide, silicon oxynitride, silicon nitride, silicon carbon nitride, silicon carbide, amorphous silicon, polysilicon, amorphous carbon, spin on hardmask (SOH), or the like. As used herein, the term "or" is not an exclusive term, e.g., "A or B" would include A, B, or A and B.

In an implementation, the material layer 140 may be formed on the exposed upper surface 120U and the exposed sidewall 120S of the target pattern 120, and may not be formed on the pyrolysis material layer 130. In an implementation, as the material layer 140 is being formed or deposited at a temperature of about 200° C. or higher, the pyrolysis material layer 130 may start to decompose at this process temperature, and, e.g., the pyrolysis material layer 130 in the opening 120H may be decomposed from a surface thereof at a predetermined rate and may be removed. For example, any source material or precursor material of the material layer 140 attached or adsorbed on the pyrolysis material layer 130 may be removed along with the pyrolysis material layer 130 (e.g., as the pyrolysis material layer 130 is decomposed and removed). The material layer 140 may be selectively formed only on the exposed surfaces of the target pattern 120 without being formed on (e.g., without remaining on) a surface of the pyrolysis material layer 130.

Figure 4:
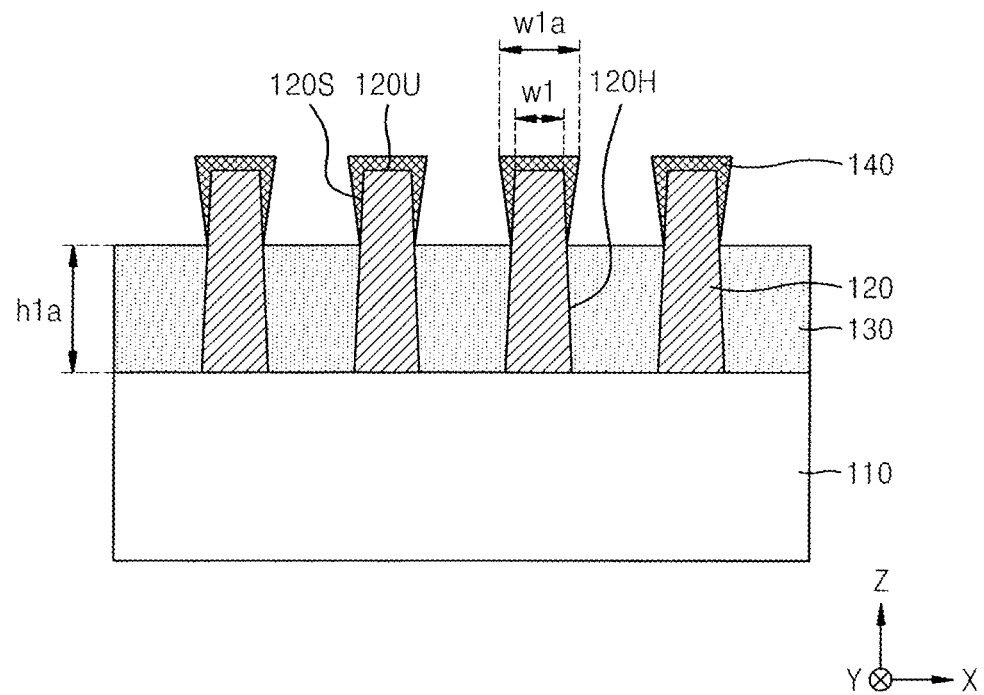

FIG. 4 illustrates a result of completion of forming of the material layer 140. As the material layer 140 is being formed to a desired thickness and width w1a, the pyrolysis material layer 130 may be decomposed and/or removed during a process of forming the material layer 140. A height h1a of the pyrolysis material layer 130 may be less than the first height h1 of the pyrolysis material layer 130 (e.g., the height prior to the forming of the material layer 140). The pyrolysis material layer 130 may be decomposed and/or removed, and the material layer 140 may be formed on the newly exposed sidewall 120S of the target pattern 120. In an implementation, as illustrated in FIG. 4, the material layer 140 may have a tapered shape, e.g., may decrease in thickness or width (as measured in the X direction) in a downward direction from the upper surface of the target pattern 120 in the vertical direction (Z direction). As described above, the material layer 140 may be selectively formed only on the exposed surfaces of the target pattern 120 without being formed on a resulting surface of the pyrolysis material layer 130.

Figure 5:
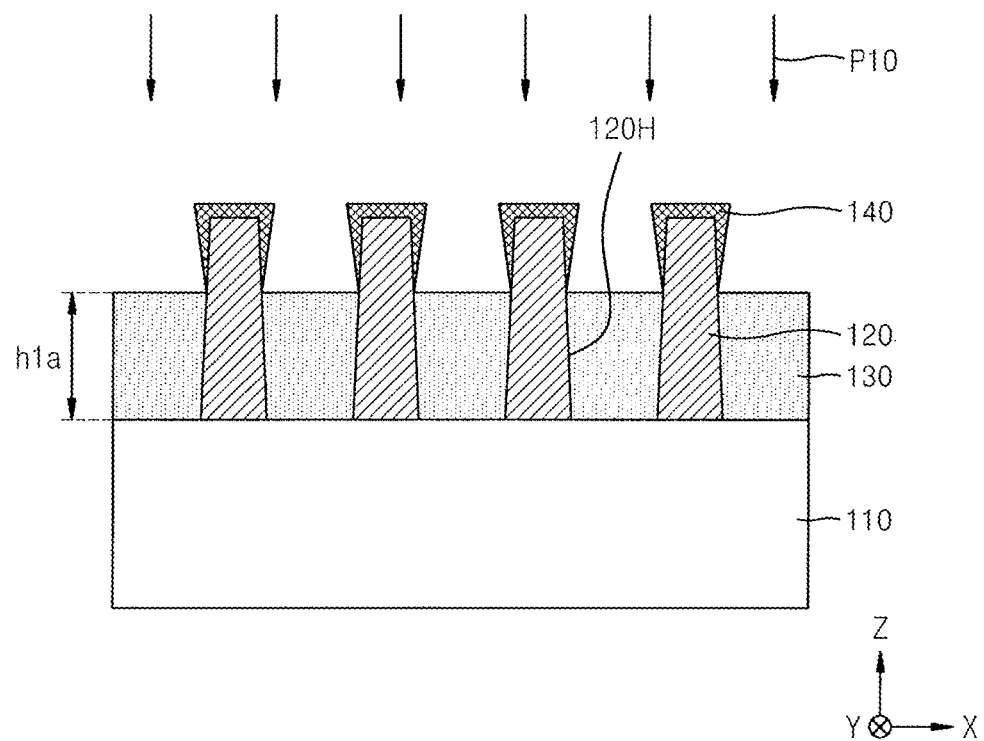

Referring to FIG. 5, a heat recess process P10 may be performed to remove the pyrolysis material layer 130. In an implementation, the heat recess process may be performed at a temperature of at least about 200° C., e.g., about 200° C. to about 400° C. The heat recess process P10 may be performed by supplying heat to the substrate 110 by using a chamber-type heater or a batch-type heater. In this case, a process of removing the pyrolysis material layer 130 may be performed without physically damaging the target pattern 120 or the material layer 140.

In an implementation, a dry etching process or wet etching process may be performed instead of or in addition to the heat recess process P10 in order to remove the pyrolysis material layer 130.

Figure 6:
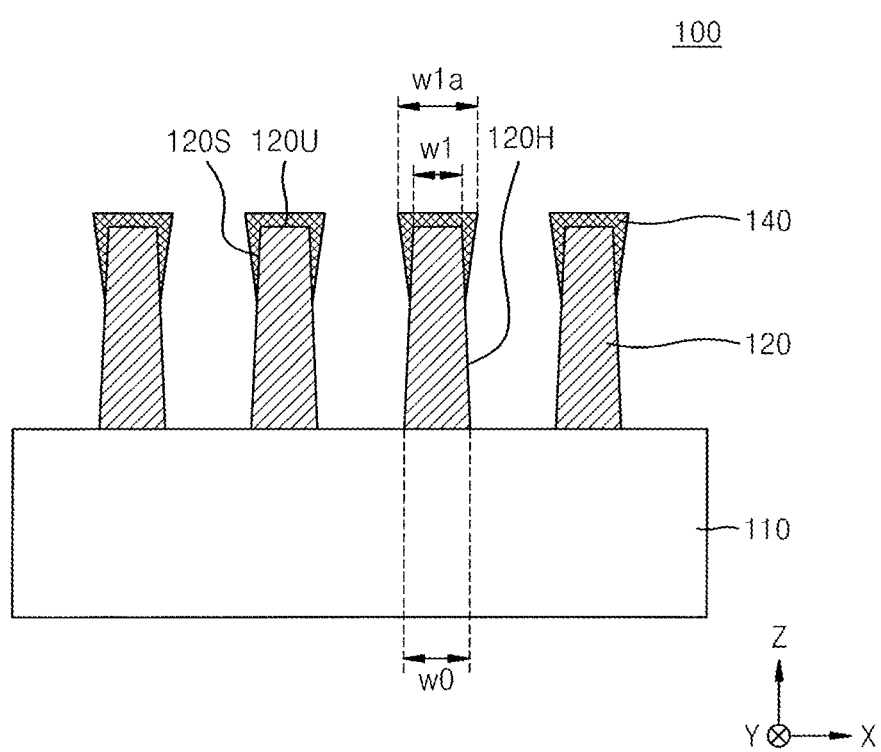

FIG. 6 illustrates the integrated circuit device 100 including the target pattern 120 and the material layer 140. An upper surface of the material layer 140 may have a width w1a greater than the upper width w1 of the target pattern 120 (e.g., in the X direction). In an implementation, the width w1a of the upper surface of the material layer 140 may be substantially the same as the first width w0 of the target pattern 120 or may have a value within about 20% of the first width w0 or within about 10% of the first width w0 (e.g., the width w1a of the upper surface of the material layer 140 may be from about 80% to about 120% of the first width w0 or from about 90% to about 110% of the first width w0).

In an implementation, the material layer 140 may be selectively formed on the upper surface 120U and the sidewall 120S of the target pattern 120 by forming the pyrolysis material layer 130 and performing the heat recess process.

When mask patterns are formed using a double patterning technique or a quadruple patterning technique, the mask patterns may have a laminate structure of a plurality of material layers, and the height of the mask patterns may be relatively large and the distance between the mask patterns may be relatively small. During a process of etching a film to be etched by using the mask patterns, an upper part of the mask patterns may also be etched or consumed, and the height and width of the mask patterns may be reduced. In this case, dimensions of the mask patterns may change during the process of etching the film to be etched (e.g., the mask patterns have different heights and widths at a start time of etching the film to be etched and at a finish time of the etching), and it is difficult to precisely control an etching amount of the film to be etched. It may be impossible to prevent such consumption of mask patterns or to selectively form mask patterns only in a required partial area.

According to the above-described example embodiments, the pyrolysis material layer 130 may be formed between the target patterns 120 having a fine pitch, and the material layer 140 may be formed on a surface of the target patterns 120 not covered with the pyrolysis material 130. It is possible to selectively form the material layer 140 only in a required or desired partial area, e.g., the upper surface and the upper sidewall of the target pattern 120. Furthermore, the pyrolysis material layer 130 may be decomposed and removed during a process of forming the material layer 140, and any remaining pyrolysis material layer 130 may be removed through an additional heat recess process. The process of removing the pyrolysis material layer 130 may be performed without physically damaging the target pattern 120 or the material layer 140.

FIGS. 7 to 16 are cross-sectional views of stages in a method of manufacturing an integrated circuit device 200 according to example embodiments.

Figure 7:
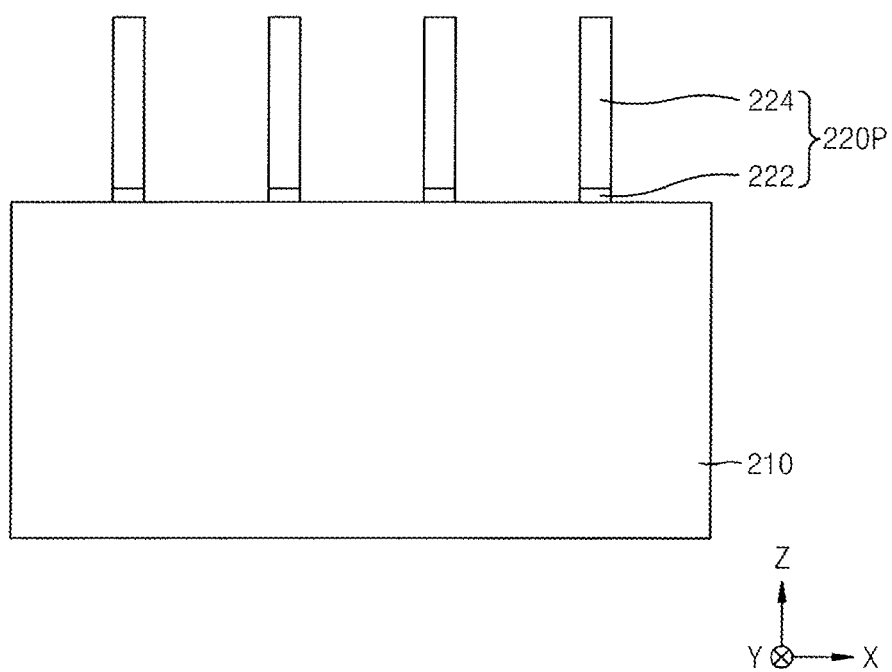
FIGS. 7 to 16 illustrate cross-sectional views of stages in a method of manufacturing an integrated circuit device according to example embodiments.

Referring to FIG. 7, a hardmask pattern 220P may be formed on a substrate 210.

In an implementation, the substrate 210 may include a semiconductor material, e.g., Si, Ge, SiGe, SiC, GaAs, InAs, or InP. In an implementation, the substrate 210 may include a conductive area, e.g., a well doped with impurities or a structure doped with impurities. In an implementation, the substrate 210 may include a buried oxide (BOX) layer.

The hardmask pattern 220P may include a pad oxide film 222 and a mask material layer 224. In an implementation, the pad oxide film 222 may include an oxide obtained by thermally oxidizing a surface of the substrate 210. The mask material layer 224 may include a silicon nitride film, a silicon oxynitride film, a spin on glass (SOG) film, a SOH film, an amorphous carbon layer, a photoresist film, or a combination thereof.

The hardmask pattern 220P may extend (e.g., lengthwise) on the substrate 210 in the second direction (Y direction) parallel to an upper surface of the substrate 210.

Figure 8:
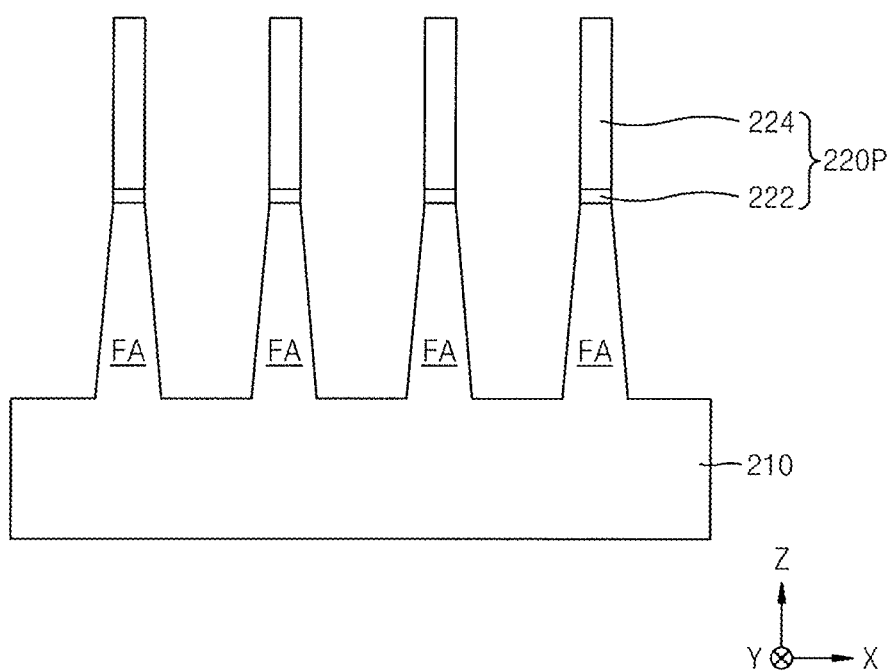

Referring to FIG. 8, a plurality of fin-type active areas FA may be formed by removing the substrate 210 by as much as a predetermined thickness using the hardmask pattern 220P as an etching mask. The plurality of fin-type active areas FA may protrude from the upper surface of the substrate 210 in the third direction (Z direction) and may extend in the second direction (Y direction).

Figure 9:
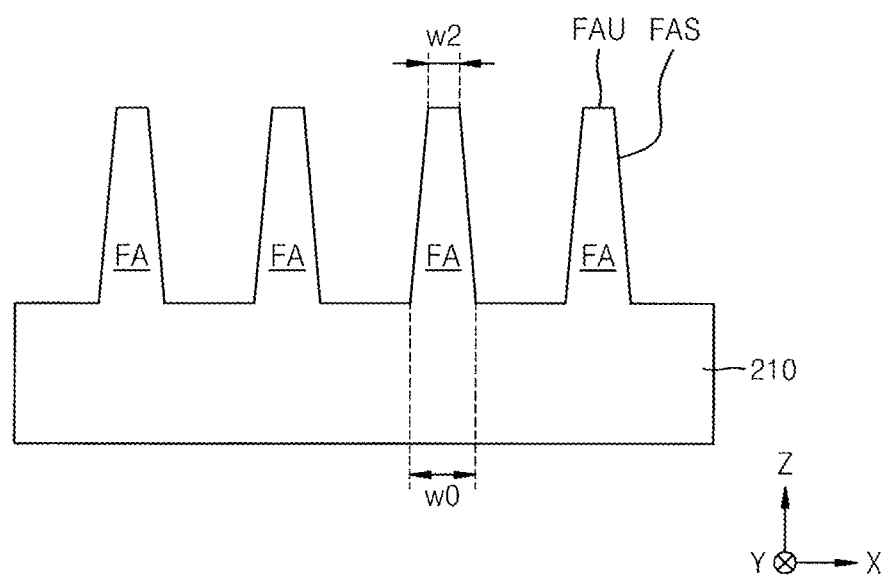

Referring to FIG. 9, the hardmask pattern 220P may be removed.

During a process of forming the plurality of fin-type active areas FA, a portion adjacent to the upper surface of the substrate 210 may be exposed to an etching atmosphere for a longer time. The plurality of fin-type active areas FA may have an inclined sidewall FAS so as to have a width that increases in a downward direction (e.g., the Z direction). An upper portion of the plurality of fin-type active areas FA may be removed by a particular thickness by being damaged or oxidized during a process of removing the hardmask pattern 220P or a subsequent cleaning process. An upper width w2 of the plurality of fin-type active areas FA in the first direction (X direction) may be less than a lower width w0 in the first direction (X direction) (e.g., the fin-type active areas FA may have a tapered shape).

Figure 10:
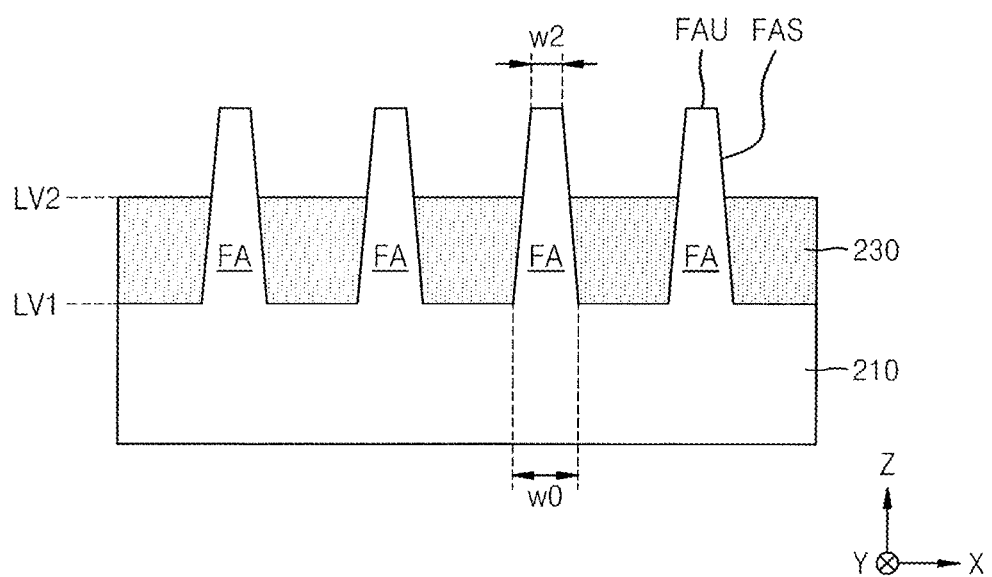

Referring to FIG. 10, a pyrolysis material layer 230, which (e.g., partially) fills a space between the sidewalls FAS of the plurality of fin-type active areas FA, may be formed. The pyrolysis material layer 230 may have a technical feature similar to that of the pyrolysis material layer 130 described with reference to FIG. 2.

In an implementation, the pyrolysis material layer 230 may have an upper surface at a second level LV2 that is higher (in the Z direction) than a first level LV1 that is the level of a bottom of the plurality of fin-type active areas FA. The pyrolysis material layer 230 may formed to a height that covers a lower side of the sidewall FAS of the plurality of fin-type active areas FA and does not cover an upper surface FAU of the plurality of fin-type active areas FA.

In an implementation, the pyrolysis material layer 230 may include a material that is decomposed at a temperature of about 200° C. to about 400° C. In an implementation, the pyrolysis material layer 230 may include, e.g., an organic compound including carbon, oxygen, hydrogen, and nitrogen. The pyrolysis material layer 230 may include organic compounds including aromatic or aliphatic hydrocarbons, or derivatives thereof, or polymers thereof. In an implementation, the pyrolysis material layer 230 may be formed through a spin coating process, a chemical vapor deposition process, or the like.

Figure 11:
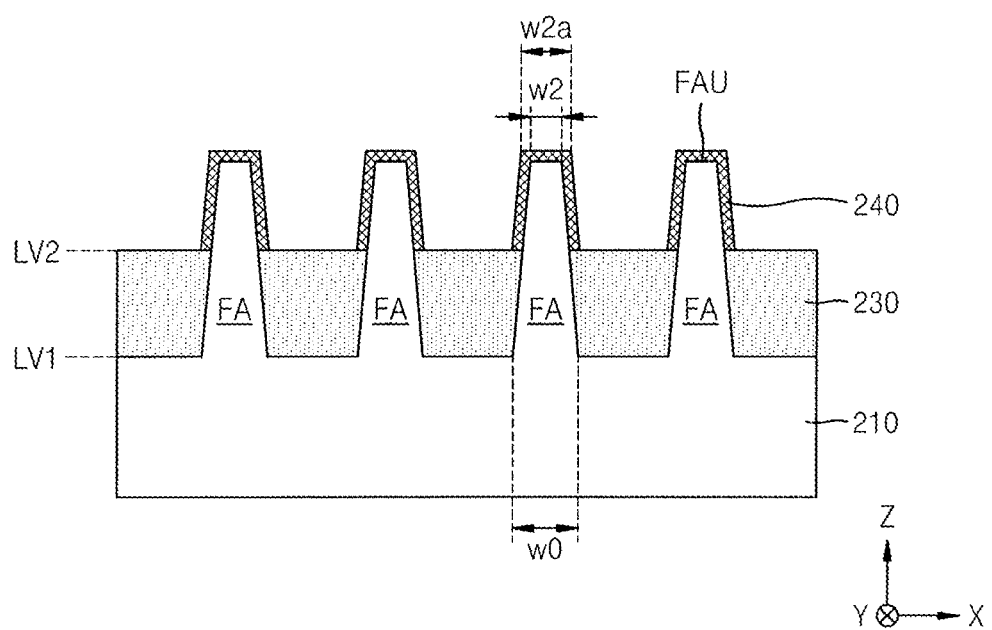

Referring to FIG. 11, a channel layer 240 may be formed on the exposed upper surface FAU and the exposed sidewall FAS of the plurality of fin-type active areas FA.

In an implementation, the channel layer 240 may be formed through an atomic layer deposition process, a chemical vapor deposition process, a spin coating process, a molecular beam epitaxy process, or the like. The channel layer 240 may be formed using argon, helium, hydrogen, and nitrogen as carrier gas at a pressure of from about 0 to about 760 torr and a temperature of about 200° C. or higher. In an implementation, the channel layer 240 may be formed using, e.g., Si, Ge, SiGe, SiC, GaAs, InAs, or InP.

The channel layer 240 may be formed only on an exposed surface of the plurality of fin-type active areas FA, e.g., without being formed on the pyrolysis material layer 230. In an implementation, when the channel layer 240 is formed at a temperature of about 200° C. or higher, the material included in the pyrolysis material layer 230 may start to decompose and may be decomposed from or at a surface of the pyrolysis material layer 230 at a predetermined rate and may be removed. Therefore, even when a part of the source material or precursor for forming the channel layer 240 is chemically adsorbed onto a surface of the pyrolysis material layer 230, the source material or precursor may be removed along with the pyrolysis material layer 230. Therefore, the channel layer 240 may be selectively formed only on the exposed surfaces of the plurality of fin-type active areas FA.

The channel layer 240 may be conformally formed to a uniform thickness on the exposed surface of the plurality of fin-type active areas FA. An uppermost surface of the channel layer 240 may have a width w2a that is greater than the upper width w2 of the plurality of fin-type active areas FA in the first direction (X direction). An upper surface of the pyrolysis material layer 230 may be at the second level LV2, and the pyrolysis material layer 230 may partially cover the sidewall FAS of the plurality of fin-type active areas FA, a bottom surface of the channel layer 240 may also be at the second level LV2.

In an implementation, the channel layer 240 may include the same material as that of the plurality of fin-type active areas FA. In an implementation, an impurity doping concentration of the channel layer 240 may be different from an impurity doping concentration of the plurality of fin-type active areas FA. In an implementation, the channel layer 240 may include a material different from that of the plurality of fin-type active areas FA. In an implementation, the plurality of fin-type active areas FA may include silicon, and the channel layer 240 may include silicon germanium. In an implementation, the channel layer 240 may include the same material as that of the plurality of fin-type active areas FA, but a composition of the channel layer 240 may be different from a composition of the plurality of fin-type active areas FA. In an implementation, the channel layer 240 and the plurality of fin-type active areas FA may include $Si_xGe_{1-x}$, but may have different Si content, e.g., x may be different in the different in the channel layer 240 and the plurality of fin-type active areas FA.

In an implementation, the channel layer 240 and a portion of the plurality of fin-type active areas FA adjacent thereto may function as a channel area of the integrated circuit device 200. Furthermore, the channel layer 240 may function as a protective layer, which may help cure a surface defect of the plurality of fin-type active areas FA or prevent surface oxidation of the plurality of fin-type active areas FA during a following oxidation process.

Figure 12:
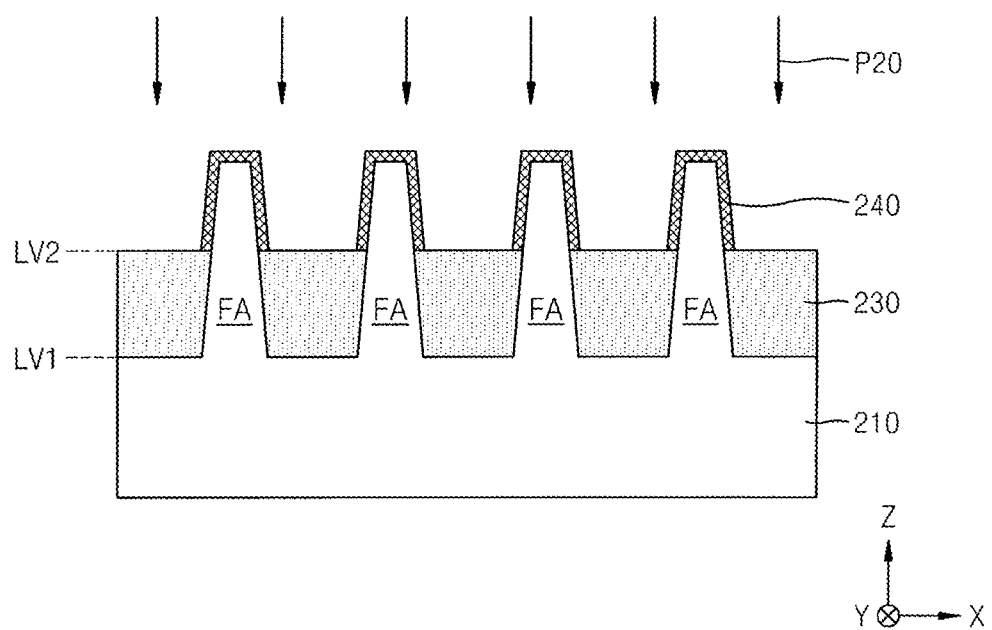

Referring to FIG. 12, a heat recess process P20 may be performed to remove the pyrolysis material layer 230. In an implementation, the heat recess process P20 may be performed at a temperature of at least about 200° C., e.g., about 200° C. to about 400° C. In this case, a process of removing the pyrolysis material layer 230 may be performed without physically damaging the fin-type active areas FA or the channel layer 240.

In an implementation, a dry etching process or wet etching process may be performed instead of or in addition to the heat recess process P20 in order to remove the pyrolysis material layer 230.

Figure 13:
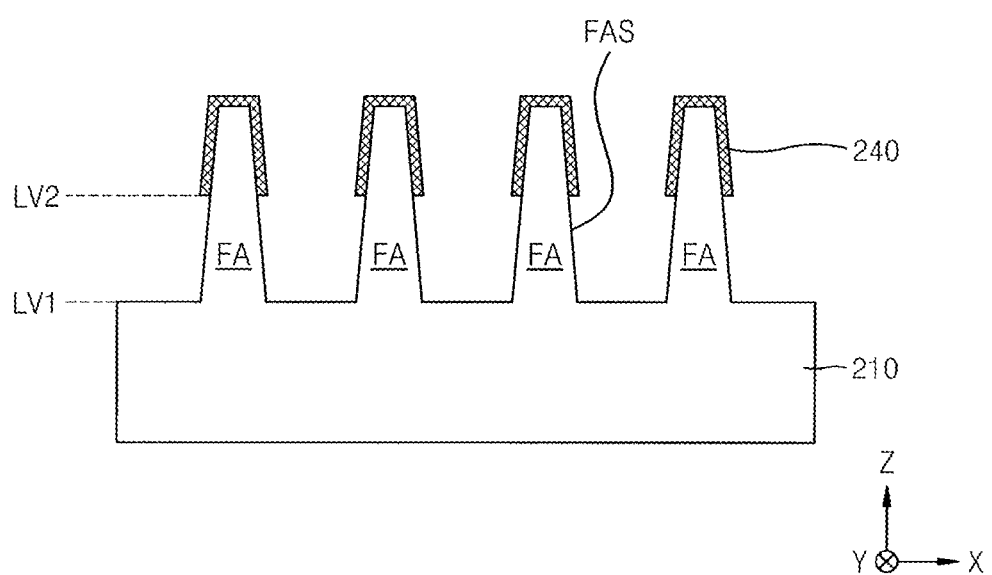

Referring to FIG. 13, a lower portion of the sidewall FAS of the plurality of fin-type active areas FA and the upper surface of the substrate 210 may be exposed again after the pyrolysis material layer 230 is removed.

Figure 14:
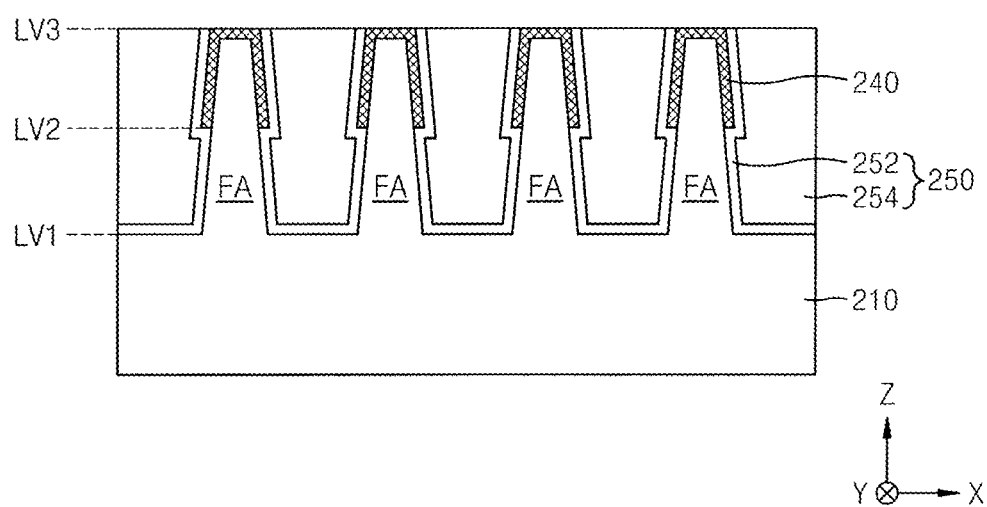

Referring to FIG. 14, a device isolation film 250 may be formed on the substrate 210, the device isolation film 250 including an insulating liner 252 and an insulating buried layer 254.

After the insulating liner 252 is formed on the substrate 210, the insulating buried layer 254 that fills a space between the plurality of fin-type active areas FA may be formed on the insulating liner 252, and upper portions of the insulating buried layer 254 and the insulating liner 252 may be removed so that an upper surface of the plurality of fin-type active areas FA is exposed so as to form the device isolation film 250.

In an implementation, the insulating liner 252 may include an oxide film formed through a process of oxidizing a surface of the plurality of fin-type active areas FA, and the oxidation process may include, e.g., an in-situ steam generation (ISSG) process, a thermal oxidation process, a UV oxidation process, or an $O_2$ plasma oxidation process. In an implementation, the insulating liner 252 may have, e.g., a thickness of about 10 Å to about 100 Å.

In an implementation, the insulating buried layer 254 may include an oxide film formed through a flowable chemical vapor deposition (FCVD) process or a spin coating process. In an implementation, the insulating buried layer 254 may include, e.g., fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or Tonen Silazene (TOSZ).

Figure 15:
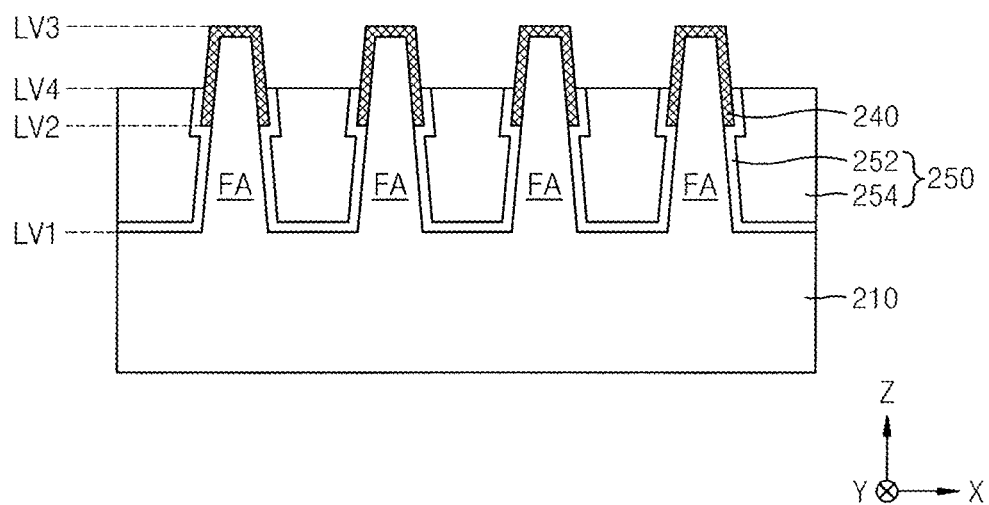

Referring to FIG. 15, an upper portion of the device isolation film 250 may be removed by a predetermined height through a recess process. Accordingly, an upper surface of the device isolation film 250 may be at a level LV4 lower (e.g., in the Z direction) than the upper surface of the fin-type active areas FA, and an upper surface and sidewall of the channel layer 240 may be exposed.

FIG. 15 exemplarily illustrates the upper surface of the device isolation film 250 as being at a higher level (e.g., LV4) than a lowermost surface level LV2 of the channel layer 240. Accordingly, the insulating liner 252 may conformally extend from the sidewall of the fin-type active areas FA onto the sidewall of the channel layer 240. Therefore, the insulating liner 252 may be between the channel layer 240 and the insulating buried layer 254 and between the plurality of fin-type active areas FA and the insulating buried layer 254.

Figure 16:
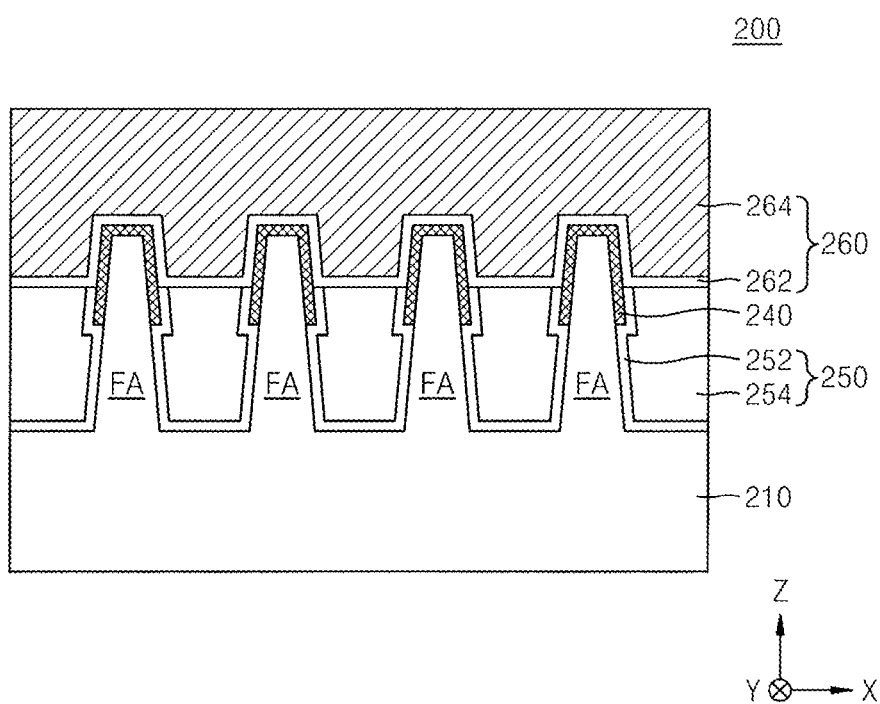

Referring to FIG. 16, a gate structure 260 extending in the second direction (Y direction) may be formed on the channel layer 240. The gate structure 260 may include a gate insulating layer 262 and a gate electrode 264. Thereafter, a recess area may be formed by removing a portion of the fin-type active areas FA arranged on both sides of the gate structure 260, and a source/drain area may be formed in the recess area through an epitaxy process.

In an implementation, the source/drain area may be formed after forming a dummy gate structure, and thereafter, a gate electrode in the dummy gate structure may be replaced with the gate electrode 264 including a metal using a replacement metal gate scheme.

The gate insulating layer 262 may include a silicon oxide film, a high-k dielectric material film, or a combination thereof. The high-k dielectric material film may include a material having a dielectric constant higher than that of the silicon oxide film. In an implementation, the gate insulating layer 262 may have a dielectric constant of from about 10 to about 25. In an implementation, the high-k dielectric material film may include, e.g., hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. In an implementation, the gate insulating layer 262 may be formed through an ALD process, a CVD process, or a PVD process.

The gate electrode 264 may include a work function adjusting metal-containing layer and a gap-filling metal-containing layer that fills a space formed on the work function adjusting metal-containing layer. In an implementation, the gate electrode 264 may have a multi-layer structure in which a metal nitride layer, a metal layer, a conductive capping layer, and a gap-fill metal film are sequentially stacked. Each of the nitride layer and the metal layer may include, e.g., Ti, W, Ru, Nb, Mo, Hf, Ni, Co, Pt, Yb, Tb, Dy, Er, or Pd. Each of the metal nitride layer and the metal layer may be formed through an ALD process, a metal organic ALD (MOALD) process, or a metal organic CVD (MOCVD) process. The conductive capping layer may serve as a protective film for preventing surface oxidation of the metal layer. Furthermore, the conductive capping layer may serve as a wetting layer for facilitating deposition of another metal layer on the above metal layer. The conductive capping layer may include, e.g., TiN, TaN, or a combination thereof. The gap-fill metal film may extend on the conductive capping layer. The gap-fill metal film may include a tungsten (W) film. The gap-fill metal film may be formed through an ALD, CVD, or PVD process. The gap-fill metal film may bury, without a void, a recess space formed by a stepped portion on an upper surface of the conductive capping layer.

The integrated circuit device 200 may be manufactured by performing the above-mentioned processes.

In the integrated circuit device 200 according to example embodiments, the channel layer 240 may be selectively formed only in or on a partial area of the plurality of fin-type active areas FA by using the pyrolysis material layer 230. Accordingly, a degree of freedom of choosing material layers of the fin-type active areas FA and the channel layer 240 may increase, and the performance of the integrated circuit device 200 may be optimized. Furthermore, the channel layer 240 may function as a protective layer for curing a surface defect of the fin-type active areas FA or preventing damage to the fin-type active areas FA, and the electrical performance of the integrated circuit device 200 may be improved.

In an implementation, as illustrated in FIG. 16, the channel layer 240 may be between the gate structure 260 and the fin-type active areas FA. In an implementation, a portion of the channel layer 240 may be removed, and the gate structure 260 may directly contact the fin-type active areas FA. In an implementation, when the channel layer 240 functions as a protective layer for protecting a surface of the fin-type active areas FA, an exposed upper surface portion of the channel layer 240 may also be removed during the following process of removing the dummy gate structure, and the upper surface and sidewall of the fin-type active areas FA may be exposed again.

FIGS. 17 to 28 are cross-sectional views of stages in a method of manufacturing an integrated circuit device 300 according to example embodiments.

Figure 17:
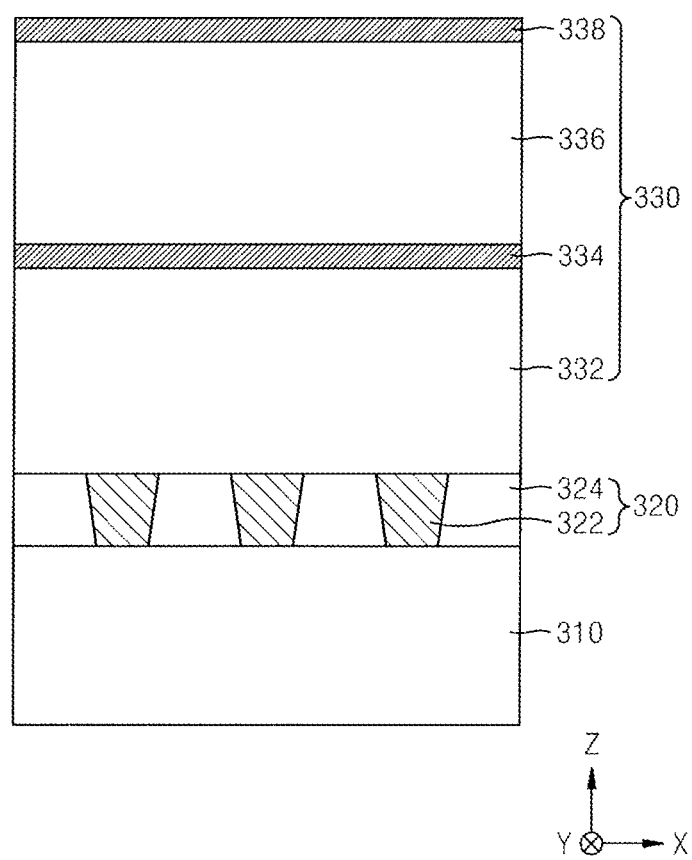
FIGS. 17 to 28 illustrate cross-sectional views of stages in a method of manufacturing an integrated circuit device according to example embodiments.

Referring to FIG. 17, a lower structure 320 may be formed on a substrate 310. The substrate 310 may include a semiconductor material, e.g., Si, Ge, SiGe, SiC, GaAs, InAs, or InP. The substrate 310 may include a conductive area, e.g., a well doped with impurities or a structure doped with impurities. A device isolation film, which defines an active area, may be further formed on the substrate 310, and a transistor may be further formed on the substrate 310, the transistor including a gate structure and a source/drain area.

The lower structure 320 may include a capacitor contact 322 on the substrate 310 and a lower insulating layer 324 covering the capacitor contact 322. In an implementation, each of the capacitor contact 322 and the lower insulating layer 324 may be a single layer, or the capacitor contact 322 and the lower insulating layer 324 may include a plurality of material layers. A portion of the lower structure 320 may cover the transistor on the substrate 310, and the capacitor contact 322 may be connected to a portion of the transistor through a wiring layer.

A mold stack 330 may be formed on the lower structure 320. The mold stack 330 may be formed by sequentially forming, on the lower structure 320, a first mold layer 332, a first support layer 334, a second mold layer 336, and a second support layer 338.

In an implementation, the first mold layer 332 and the second support layer 334 may include materials having etch selectivity for each other. In an implementation, in the case where the first mold layer 332 includes silicon oxide, the first support layer 334 may include silicon nitride, silicon oxynitride, or silicon carbon nitride (SiCN). Furthermore, the first and second mold layers 332 and 336 and the first and second support layers 334 and 338 may include materials having etch selectivity for each other. In an implementation, in the case where the first and second mold layers 332 and 336 include silicon oxide, the first and second support layers 334 and 338 may include silicon nitride, silicon oxynitride, silicon boron nitride (SiBN), or silicon carbon nitride (SiCN).

Figure 18:
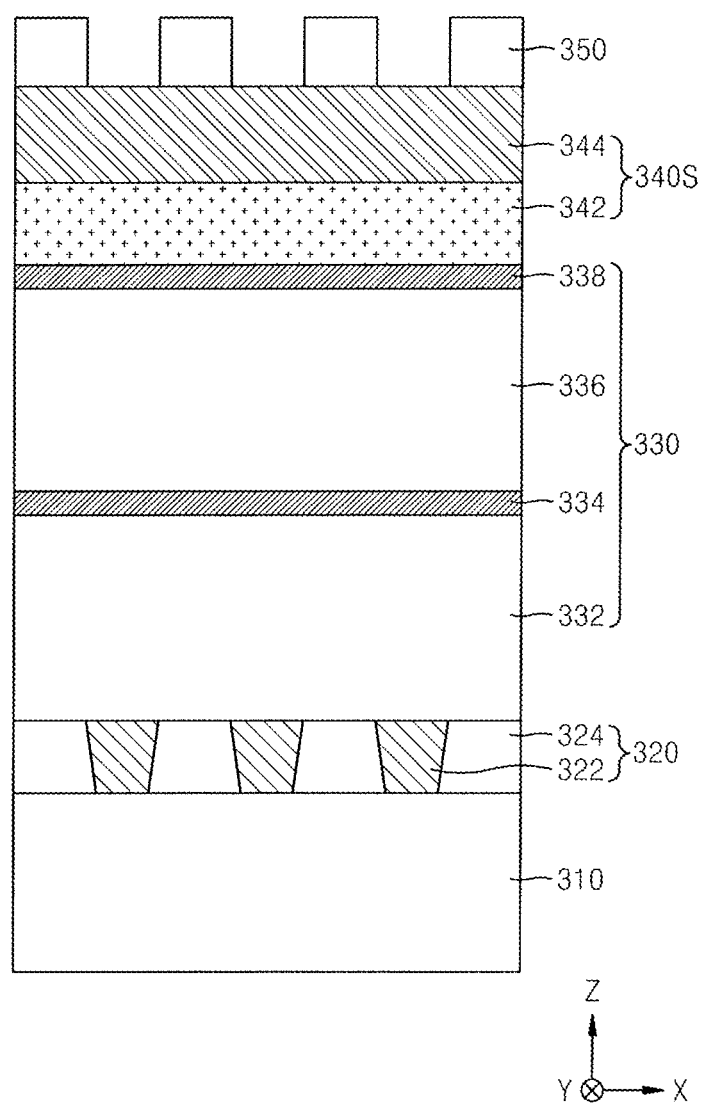

Referring to FIG. 18, a hardmask stack 340S may be formed on the second support layer 338. The hardmask stack 340S may include a first hardmask layer 342 and a second hardmask layer 344 sequentially formed on the second support layer 338. Each of the first and second hardmask layers 342 and 344 may independently include, e.g., silicon oxide, silicon oxynitride, silicon nitride, silicon carbon nitride, silicon carbide, amorphous silicon, polysilicon, amorphous carbon, or spin on hardmask. In an implementation, the first hardmask layer 342 may include silicon nitride, and the second hardmask layer 344 may include silicon carbon nitride. In an implementation, the first hardmask layer 342 may include silicon nitride, and the second hardmask layer 344 may include polysilicon.

Thereafter, a photoresist pattern 350 may be formed on the hardmask stack 340S.

Figure 19:
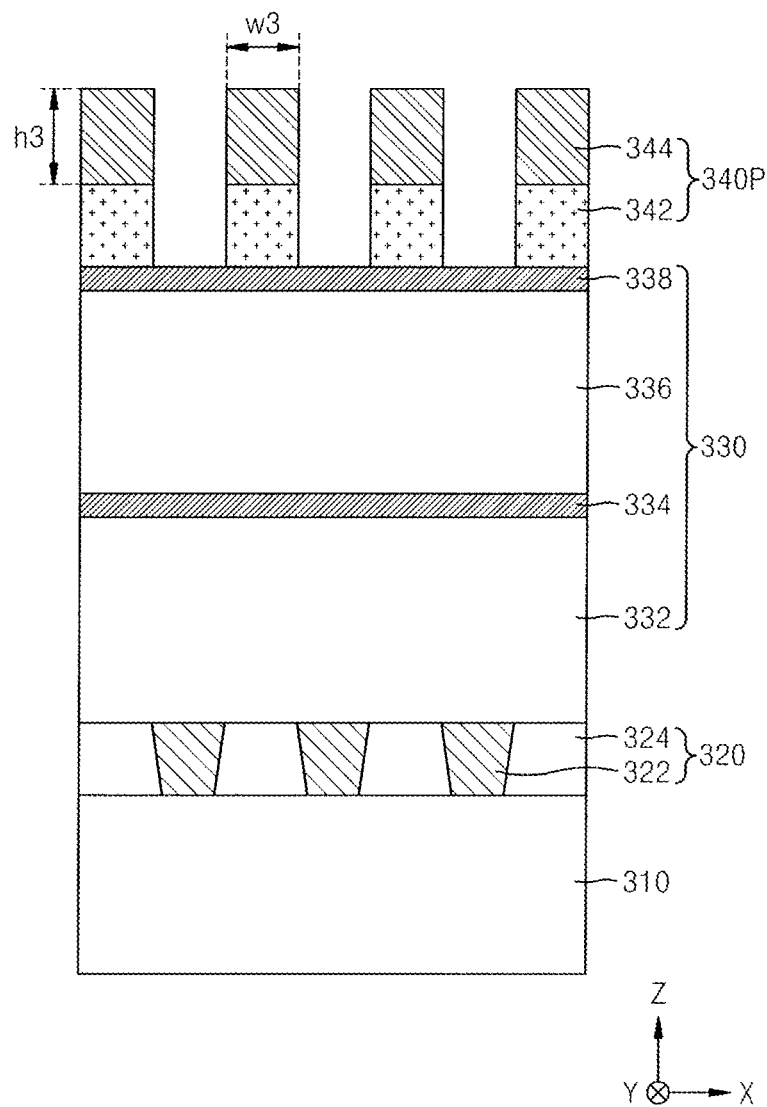

Referring to FIG. 19, a hardmask pattern 340P may be formed by patterning the hardmask stack 340S by using the photoresist pattern 350 as an etching mask. The hardmask pattern 340P may have a first width w3 in the first direction (X direction), and may extend in the second direction (Y direction). In an implementation, the second hardmask layer 344 may have a first height h3 (in the Z direction) and the first width w3.

In an implementation, as illustrated in FIG. 19, a pitch of the hardmask patterns 340P may be substantially equal to a pitch of the photoresist patterns 350 (see FIG. 18). In an implementation, a double patterning technique or a quadruple patterning technique may be used so that the pitch of the hardmask patterns 340P may be about half or about one fourth of the pitch of the photoresist patterns 350.

Figure 20:
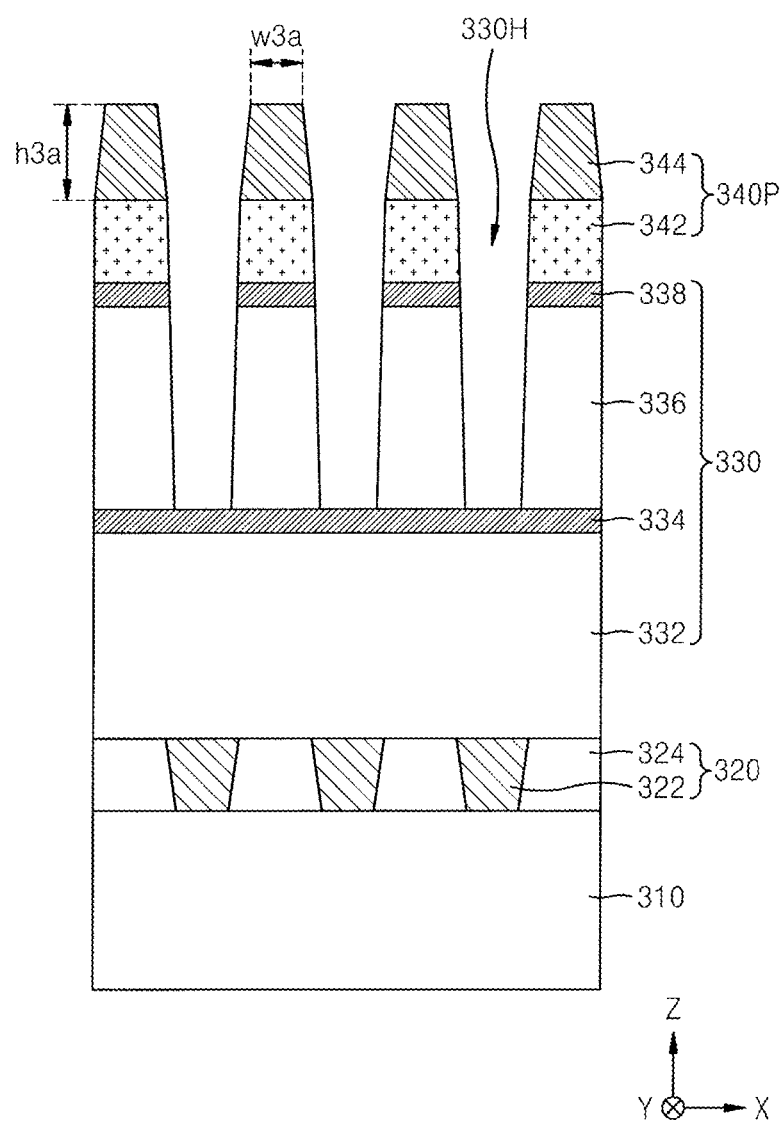

Referring to FIG. 20, an opening 330H may be formed by etching the second support layer 338 and the second mold layer 336 by using the hardmask pattern 340P as an etching mask. In an implementation, a height of the second mold layer 336 (in the Z direction) may be relatively large, a portion of the hardmask pattern 340P may be consumed during a process of etching the second mold layer 336, and the hardmask pattern 340P may be reduced in width and height. In an implementation, the second hardmask layer 344 may have a second width w3a in the first direction (X direction), and this width may be less than the first width w3 of the second hardmask layer 344 before the etching of the second mold layer 336. In an implementation, the second hardmask layer 344 may have a second height h3a in the vertical direction (Z direction), which may be less than the first height h3 of the second hardmask layer 344 before the etching of the second mold layer 336.

Figure 21:
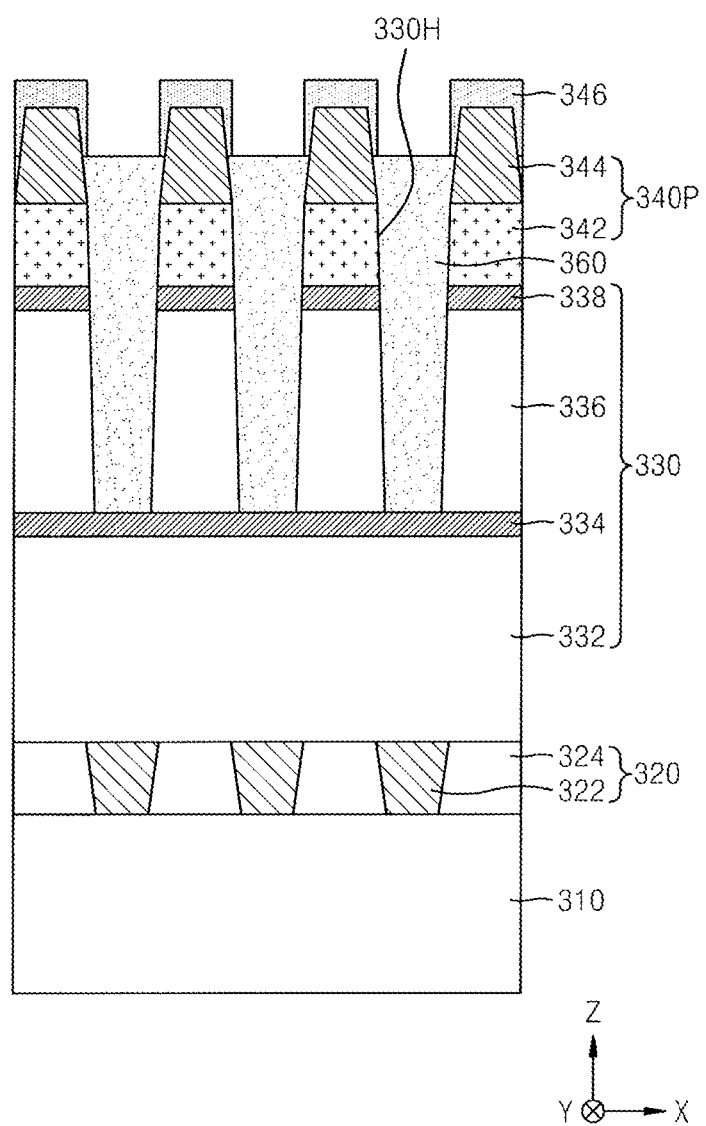

Referring to FIG. 21, a pyrolysis material layer 360 may be formed in the opening 330H. The pyrolysis material layer 360 may be formed to a height such that an upper surface and sidewall of the second hardmask layer 344 may be exposed. In an implementation, an upper surface of the pyrolysis material layer 360 (e.g., surface facing away from the substrate 310 in the Z direction) may be at a level higher (e.g., farther from the substrate 310 in the Z direction) than a bottom (e.g., substrate 310-facing) surface of the second hardmask layer 344. In an implementation, the upper surface of the pyrolysis material layer 360 may be at the same level as the bottom surface of the second hardmask layer 344.

In an implementation, the pyrolysis material layer 360 may include a material that is decomposed at a temperature of about 200° C. to about 400° C. In an implementation, the pyrolysis material layer 360 may include, e.g., an organic compound including carbon, oxygen, hydrogen, and nitrogen. The pyrolysis material layer 360 may include organic compounds including aromatic or aliphatic hydrocarbons, or derivatives thereof, or polymers thereof. In an implementation, the pyrolysis material layer 360 may be formed through a spin coating process, a chemical vapor deposition process, or the like.

A hardmask capping layer 346 may be formed on the second hardmask layer 344. The hardmask capping layer 346 may be selectively formed on an exposed surface of the second hardmask layer 344. In an implementation, the hardmask capping layer 346 may be formed using the same material as that of the second hardmask layer 344.

In an implementation, the hardmask capping layer 346 may be formed through an atomic layer deposition process, a chemical vapor deposition process, a spin coating process, a molecular beam epitaxy process, or the like. The hardmask capping layer 346 may be formed using argon, helium, hydrogen, and nitrogen as carrier gas at a pressure of from about 0 to about 760 torr and a temperature of about 200° C. or higher. In an implementation, the hardmask capping layer 346 may include silicon oxide, silicon oxynitride, silicon nitride, silicon carbon nitride, silicon carbide, amorphous silicon, polysilicon, amorphous carbon, or spin on hardmask.

Figure 22:
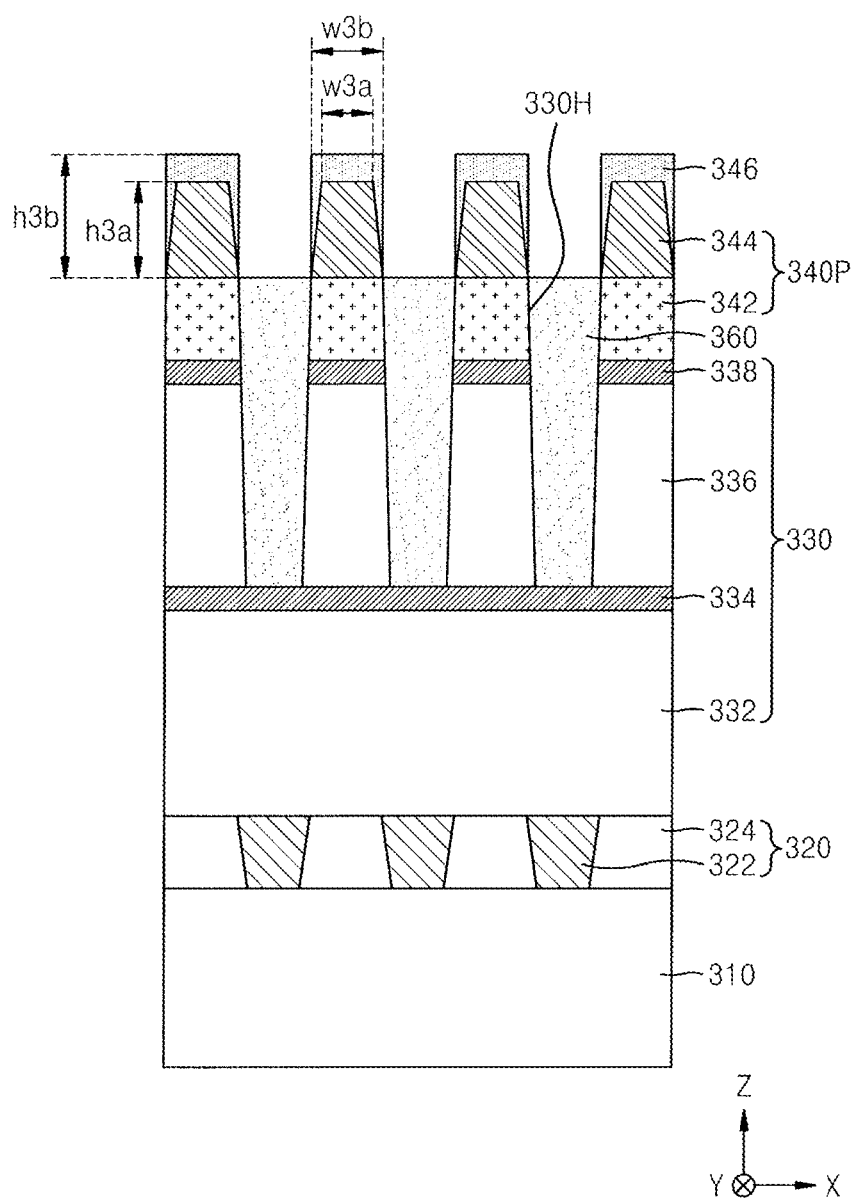

Referring to FIG. 22, the hardmask capping layer 346 may be formed (e.g., the hardmask capping layer 346 may expand) on an exposed surface of the hardmask pattern 340P, e.g., the upper surface and sidewall of the second hardmask layer 344, without being formed (e.g., without remaining) on the pyrolysis material layer 360. In an implementation, when the hardmask capping layer 346 is formed at a temperature of about 200° C. or higher, the material included in the pyrolysis material layer 360 may start to decompose at this process temperature, and may be decomposed from a surface of the pyrolysis material layer 360 at a predetermined rate and may be removed. Therefore, even when a certain amount of source material or precursor for forming the hardmask capping layer 346 is chemically adsorbed onto a surface of the pyrolysis material layer 360, this source material or precursor may be removed along with the pyrolysis material layer 360. Therefore, the hardmask capping layer 346 may be selectively formed only on (e.g., and may remain on) the exposed surface of the hardmask pattern 340P.

The hardmask capping layer 346 may be selectively formed on the upper surface and sidewall of the second hardmask layer 344, and the hardmask capping layer 346, which covers the second hardmask layer 344, may have a third width w3b in the first direction (X direction) and a third height h3b in the vertical direction (Z direction). The third width w3b may be greater than the second width w3a, and the third height h3b may be greater than the second height h3a.

Figure 23:
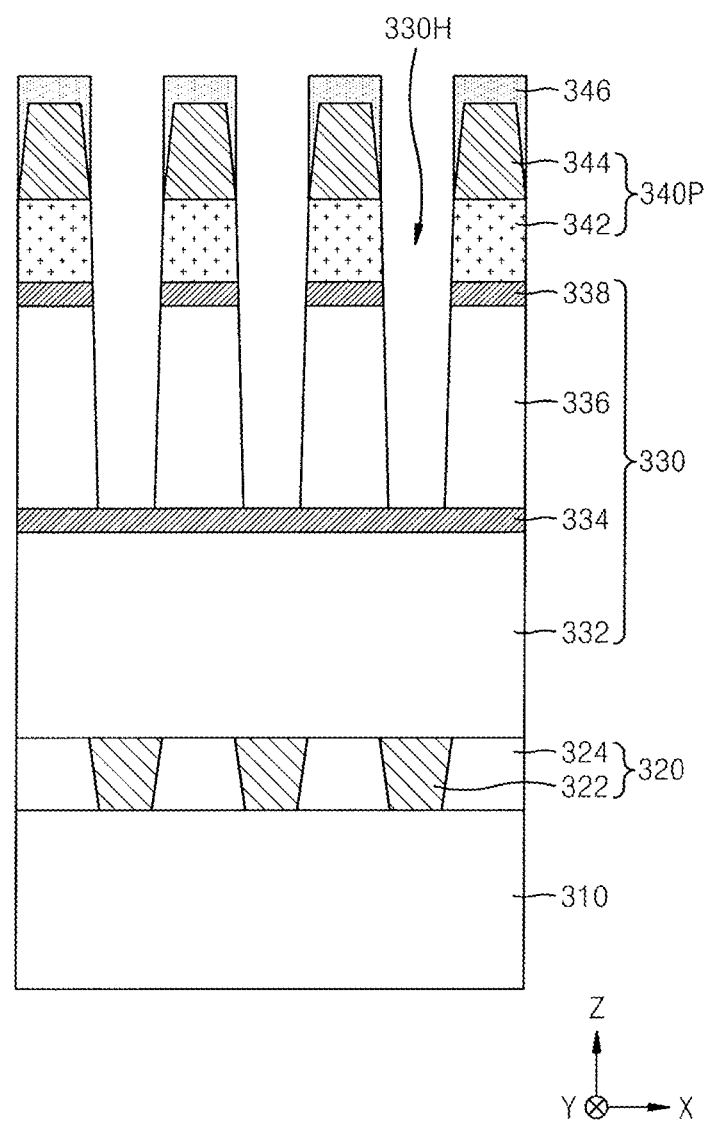

Referring to FIG. 23, the pyrolysis material layer 360 may be removed. In an implementation, the pyrolysis material layer 360 may be removed by performing a heat recess process at a temperature of at least about 200° C., e.g., about 200° C. to about 400° C. In an implementation, a dry etching process or wet etching process may be performed instead of or in addition to the heat recess process in order to remove the pyrolysis material layer 360. After the pyrolysis material layer 360 is removed, sidewalls of the second mold layer 336 and the second support layer 338 may be exposed on an inner wall of the opening 330H.

Figure 24:
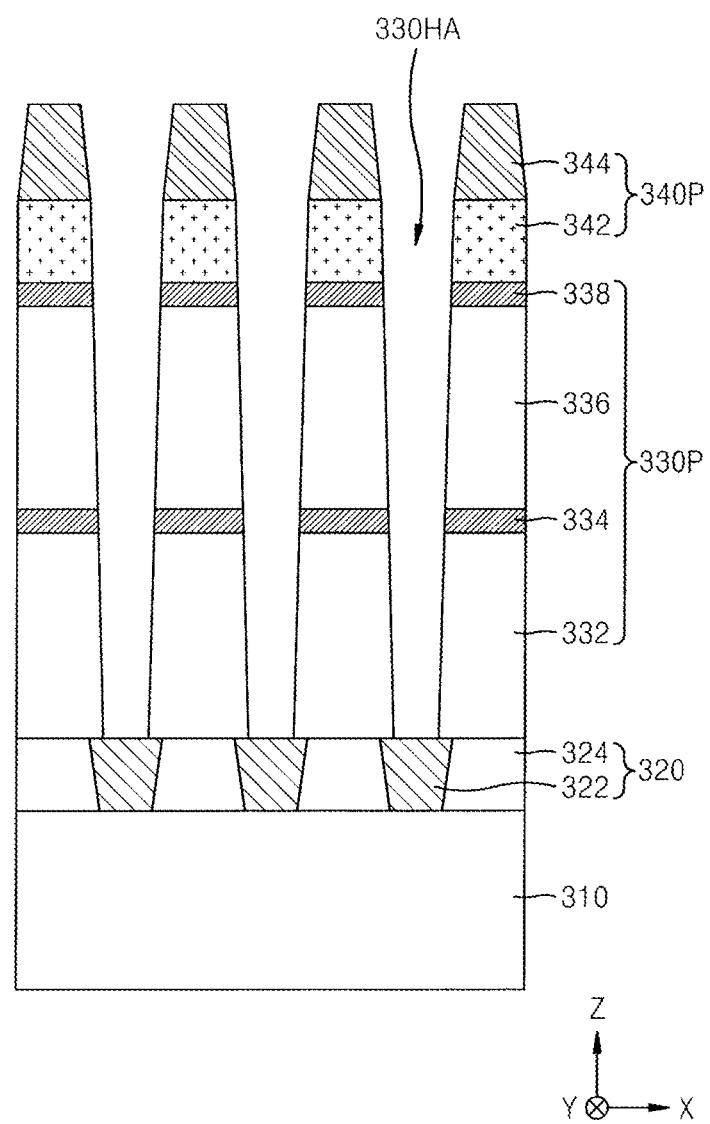

Referring to FIG. 24, an opening 330HA may be formed by etching the first support layer 334 and the first mold layer 332 by using the hardmask pattern 340P and the hardmask capping layer 346 as an etching mask. As a result, a mold structure 330P may be formed, and an upper surface of the lower structure 320 may be exposed on or at a bottom of the opening 330HA.

In an implementation, a height of the first mold layer 332 may be relatively large, and a portion of the hardmask capping layer 346 may be consumed during a process of etching the first mold layer 332. In an implementation, as illustrated in FIG. 24, the hardmask capping layer 346 may be completely removed. In an implementation, the hardmask capping layer 346 may remain on an upper surface and/or sidewall of the hardmask pattern 340P without being removed.

Figure 25:
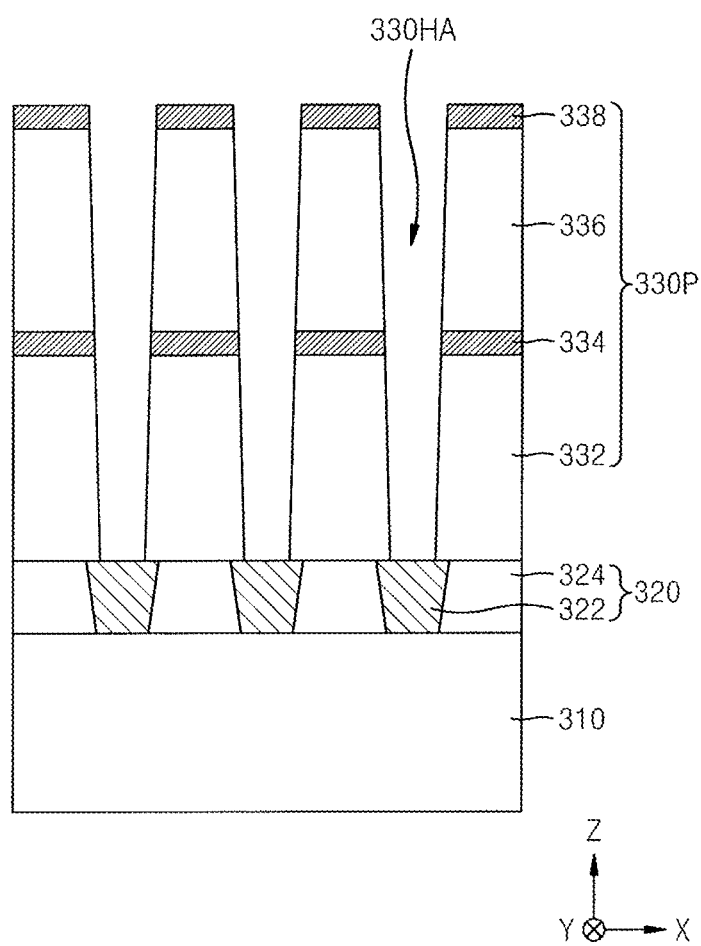

Referring to FIG. 25, the hardmask pattern 340P may be removed.

Figure 26:
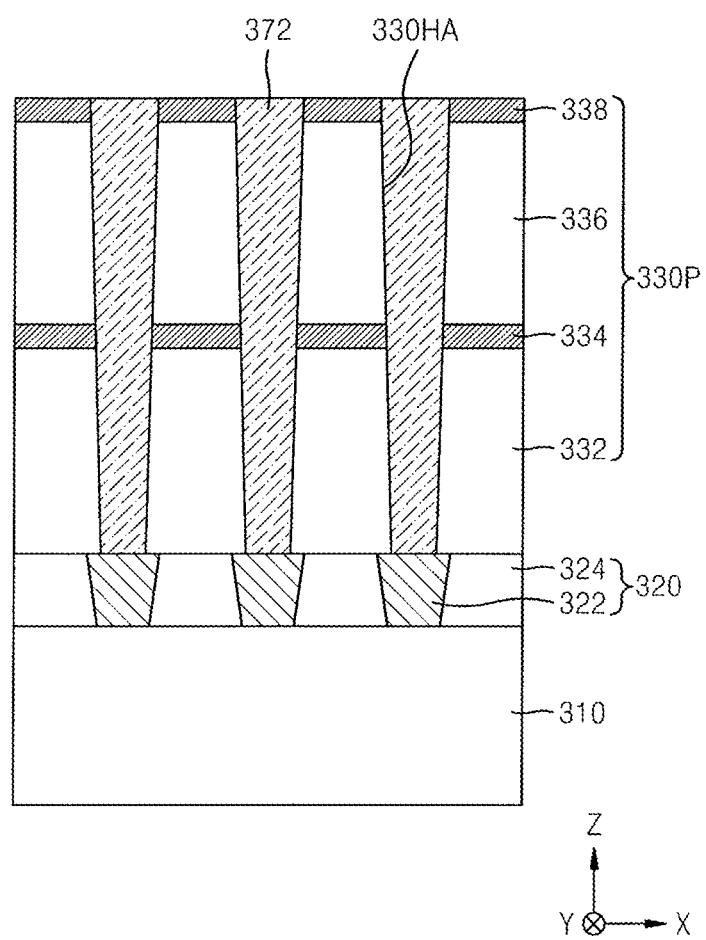

Referring to FIG. 26, a conductive layer filling the opening 330HA may be formed on the mold structure 350P, and an upper portion of the conductive layer may be removed so that an upper surface of the second support layer 338 is exposed so as to form a lower electrode 372 in the opening 330HA.

In an implementation, the lower electrode 372 may be formed through a chemical vapor deposition (CVD) process, a metal organic CVD (MOCVD) process, an atomic layer deposition (ALD) process, or a metal organic ALD (MOALD) process using doped polysilicon, metals such as ruthenium (Ru), titanium (Ti), tantalum (Ta), or tungsten (W), conductive metal nitrides such as titanium nitride (TiN), tantalum nitride (TaN), tungsten nitride (WN), or niobium nitride, or conductive metal oxides such as iridium oxide.

In an implementation, as illustrated in FIG. 26, the lower electrode 372 may have a pillar shape that completely fills the inside of the opening 330HA. In an implementation, the lower electrode 372 may be formed to a conformal thickness on an inner wall of the opening 330HA.

Figure 27:
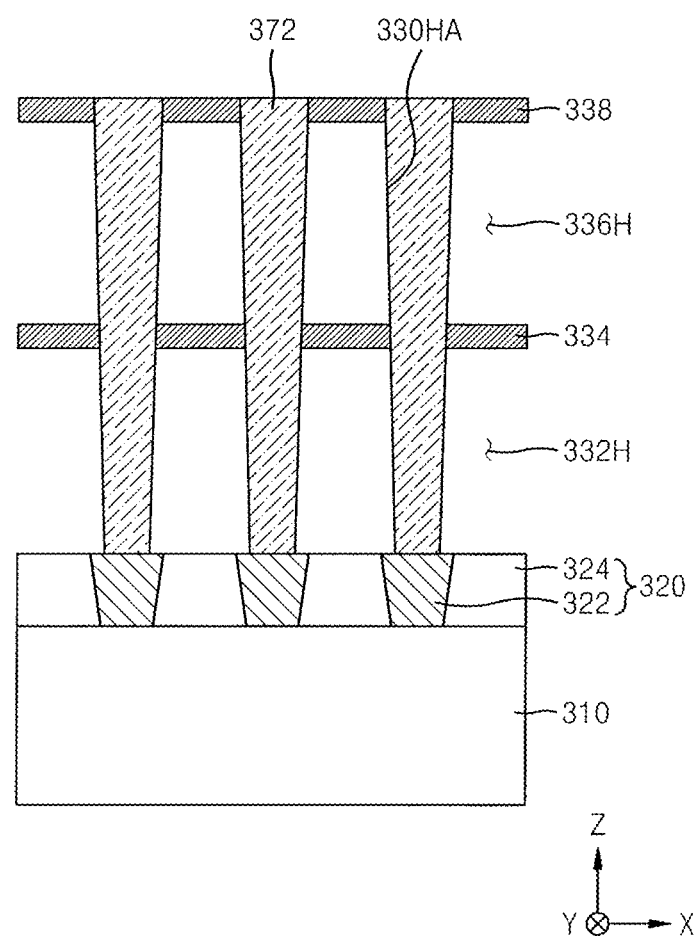

Referring to FIG. 27, a first mold opening 332H and a second mold opening 336H may be formed by removing the first mold layer 332 and the second mold layer 336. During a process of removing the first mold layer 332 and the second mold layer 336, the first support layer 334 and the second support layer 338 may not be removed, and the lower electrode 372 may be connected to the first and second support layers 334 and 338 and may be supported thereby.

Figure 28:
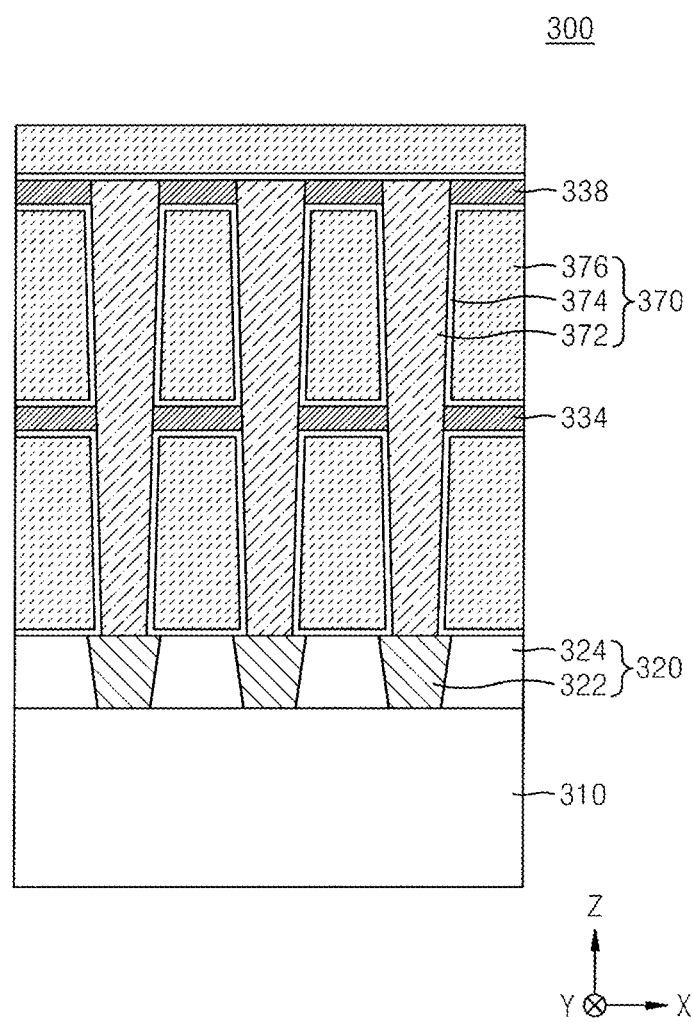

Referring to FIG. 28, a dielectric layer 374 may be conformally formed on the lower electrode 372, the first support layer 334, and the second support layer 338.

In an implementation, the dielectric layer 374 may be formed through a CVD process, an MOCVD process, an ALD process, an MOALD process, or the like. In an implementation, the dielectric layer 374 may include, e.g., zirconium oxide, aluminum oxide, silicon oxide, titanium oxide, yttrium oxide, scandium oxide, hafnium oxide, or lanthanide oxide. The dielectric layer 374 may be formed as a laminate structure of a plurality of material layers.

Thereafter, an upper electrode 376 may be formed on the dielectric layer 374.

The upper electrode 376 may include, e.g., doped polysilicon, metals such as ruthenium (Ru), titanium (Ti), tantalum (Ta), or tungsten (W), conductive metal nitrides such as titanium nitride (TiN), tantalum nitride (TaN), tungsten nitride (WN), or niobium nitride, or conductive metal oxides such as iridium oxide. The upper electrode 376 may be formed through a CVD process, an MOCVD process, an ALD process, an MOALD process, or the like.

As a result, a capacitor structure 370 including the lower electrode 372, the dielectric layer 374, and the upper electrode 376 may be formed.

According to the above example embodiments, an opening 330HA may be formed by etching the mold stack 330 to a predetermined height (e.g., by etching the second mold layer 336 and the second support layer 338) by using the hardmask pattern 340P as an etching mask, and thereafter, the hardmask capping layer 346 may be selectively formed on the hardmask pattern 340P, which is consumed. The opening 330HA may be formed by etching the mold stack 330 by as much as a remaining height thereof (e.g., by etching the first mold layer 332 and the first support layer 334) by using the hardmask pattern 340P and the hardmask capping layer 346 together as an etching mask. Therefore, a desired material may be selectively formed on a desired portion of the hardmask pattern 340P, and the opening 330HA having a relatively large aspect ratio (e.g., having a relatively large height and narrow width) may be formed.

By way of summation and review, during a process of etching a film to be etched, a mask pattern may also be etched, and the width and height of the mask pattern may decrease, thus making it difficult to precisely control an etching amount of the film to be etched.

One or more embodiments may provide a method of manufacturing an integrated circuit device through selective deposition.

One or more embodiments may provide a method of manufacturing an integrated circuit device, which makes it possible to selectively form a material layer in a partial area of a target pattern.

One or more embodiments may provide an integrated circuit device manufactured using a manufacturing method, which makes it possible to selectively form a material layer in a partial area of a target pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   a fin-type active area protruding from a substrate and extending in a first direction parallel to an upper surface of the substrate;
   a channel layer on an upper surface and an upper portion of a sidewall of the fin-type active area;
   a device isolation film on a lower portion of the sidewall of the fin-type active area on the substrate; and
   a gate structure on the fin-type active area and the device isolation film and extending in a second direction that is parallel to the upper surface of the substrate and perpendicular to the first direction,
   wherein a bottom surface of the channel layer is at a higher level than a bottom surface of the device isolation film.

2. The integrated circuit device as claimed in claim 1, wherein the bottom surface of the channel layer is at a lower level than an upper surface of the device isolation film.

3. The integrated circuit device as claimed in claim 1, wherein the channel layer is between the device isolation film and the fin-type active area.

4. The integrated circuit device as claimed in claim 1, wherein:
   the lower portion of the sidewall of the fin-type active area contacts the device isolation film, and
   the upper portion of the sidewall of the fin-type active area contacts the channel layer.

5. The integrated circuit device as claimed in claim 1, wherein:

the device isolation film includes:
an insulating liner conformally arranged on the sidewall of the fin-type active area; and
an insulating buried layer arranged on the insulating liner,
an upper portion of the insulating liner contacts the channel layer, and
a lower portion of the insulating liner contacts the fin-type active area.

6. The integrated circuit device as claimed in claim 5, wherein the bottom surface of the channel layer is at a lower level than an upper surface of the insulating buried layer.

7. The integrated circuit device as claimed in claim 5, wherein the gate structure includes:
a gate insulating layer arranged on the channel layer and the device isolation film; and
a gate electrode arranged on the gate insulating layer.

8. The integrated circuit device as claimed in claim 7, wherein the channel layer contacts the device isolation film and the gate insulating layer.

9. The integrated circuit device as claimed in claim 1, wherein:
the channel layer includes a material different from that of the fin-type active area, and
the channel layer includes Si, Ge, SiGe, SiC, GaAs, InAs, or InP.

10. An integrated circuit device, comprising:
a fin-type active area protruding from a substrate and extending in a first direction parallel to an upper surface of the substrate, the fin-type active area including a first material;
a channel layer on an upper surface and an upper portion of a sidewall of the fin-type active area, the channel layer including a second material different from the first material;
a device isolation film on the substrate to cover a lower portion of the sidewall of the fin-type active area and a portion of the channel layer; and
a gate structure on the fin-type active area and the device isolation film and extending in a second direction that is parallel to the upper surface of the substrate and perpendicular to the first direction.

11. The integrated circuit device as claimed in claim 10, wherein:
the first material includes Si, Ge, SiGe, SiC, GaAs, InAs, or InP, and
the second material includes Si, Ge, SiGe, SiC, GaAs, InAs, or InP.

12. The integrated circuit device as claimed in claim 10, wherein:
the lower portion of the sidewall of the fin-type active area contacts the device isolation film, and
the upper portion of the sidewall of the fin-type active area contacts the channel layer.

13. The integrated circuit device as claimed in claim 10, wherein:
the device isolation film includes:
an insulating liner conformally arranged on the sidewall of the fin-type active area; and
an insulating buried layer arranged on the insulating liner,
an upper portion of the insulating liner contacts the channel layer, and
a lower portion of the insulating liner contacts the fin-type active area.

14. The integrated circuit device as claimed in claim 13, wherein a bottom surface of the channel layer is at a lower level than an upper surface of the insulating buried layer and at a higher level than a bottom surface of the insulating buried layer.

15. The integrated circuit device as claimed in claim 10, wherein the gate structure includes:
a gate insulating layer arranged on the channel layer and the device isolation film; and
a gate electrode arranged on the gate insulating layer.

16. The integrated circuit device as claimed in claim 15, wherein the channel layer contacts the device isolation film and the gate insulating layer.

17. An integrated circuit device, comprising:
a fin-type active area protruding from a substrate and extending in a first direction parallel to an upper surface of the substrate;
a channel layer on an upper surface and an upper portion of a sidewall of the fin-type active area;
a device isolation film on the substrate to cover a lower portion of the sidewall of the fin-type active area and a portion of the channel layer; and
a gate structure on the fin-type active area and the device isolation film and extending in a second direction that is parallel to the upper surface of the substrate and perpendicular to the first direction,
wherein a bottom surface of the channel layer is at a lower level than an upper surface of the device isolation film and at a higher level than a bottom surface of the device isolation film.

18. The integrated circuit device as claimed in claim 17, wherein:
the fin-type active area includes a first material,
the channel layer includes a second material different from the first material,
the first material includes Si, Ge, SiGe, SiC, GaAs, InAs, or InP, and
the second material includes Si, Ge, SiGe, SiC, GaAs, InAs, or InP.

19. The integrated circuit device as claimed in claim 17, wherein:
the lower portion of the sidewall of the fin-type active area contacts the device isolation film,
the upper portion of the sidewall of the fin-type active area contacts the channel layer,
the gate structure includes a gate insulating layer and a gate electrode, and
the channel layer contacts the device isolation film and the gate insulating layer.

20. The integrated circuit device as claimed in claim 17, wherein:
the device isolation film includes:
an insulating liner conformally arranged on the sidewall of the fin-type active area; and
an insulating buried layer arranged on the insulating liner,
an upper portion of the insulating liner contacts the channel layer, and
a lower portion of the insulating liner contacts the fin-type active area.

* * * * *